(12) United States Patent
Yasuda et al.

(10) Patent No.: US 8,912,822 B2
(45) Date of Patent: Dec. 16, 2014

(54) SEMICONDUCTOR INTEGRATED CIRCUIT

(71) Applicant: Kabushiki Kaisha Toshiba, Tokyo (JP)

(72) Inventors: Shinichi Yasuda, Tokyo (JP); Masato Oda, Yokohama (JP); Shinobu Fujita, Inagi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 12 days.

(21) Appl. No.: 13/753,091

(22) Filed: Jan. 29, 2013

(65) Prior Publication Data

US 2013/0257477 A1 Oct. 3, 2013

(30) Foreign Application Priority Data

Mar. 27, 2012 (JP) ................................. 2012-072515

(51) Int. Cl.
*H03K 19/177* (2006.01)
(52) U.S. Cl.
CPC .... *H03K 19/17748* (2013.01); *H03K 19/17728* (2013.01)
USPC .............................................. 326/38; 326/41
(58) Field of Classification Search
None
See application file for complete search history.

(56) References Cited

U.S. PATENT DOCUMENTS

| 6,888,373 | B2 | 5/2005 | Kaptanoglu et al. | |
| 7,028,281 | B1 * | 4/2006 | Agrawal et al. | 326/41 |
| 7,167,022 | B1 | 1/2007 | Schleicher et al. | |
| 7,224,181 | B1 * | 5/2007 | Schmit et al. | 326/38 |
| 7,330,050 | B2 * | 2/2008 | Redgrave | 326/38 |
| 7,525,342 | B2 * | 4/2009 | Teig et al. | 326/38 |
| 7,532,030 | B2 * | 5/2009 | Redgrave | 326/38 |
| 7,570,077 | B2 * | 8/2009 | Redgrave | 326/38 |
| 7,671,625 | B1 | 3/2010 | Schleicher et al. | |
| 8,775,744 | B2 * | 7/2014 | Chin et al. | 711/149 |
| 2012/0230105 | A1 | 9/2012 | Yasuda et al. | |

FOREIGN PATENT DOCUMENTS

| JP | 5-259847 | 10/1993 |
| JP | 2008-17113 | 1/2008 |
| WO | WO 2010/106876 A1 | 9/2010 |

OTHER PUBLICATIONS

Notification of Reasons for Refusal issued by the Japanese Patent Office on Jul. 4, 2014, for Japanese Patent Application No. 2012-072515, and English-language translation thereof.

* cited by examiner

*Primary Examiner* — Crystal L Hammond
(74) *Attorney, Agent, or Firm* — Finnegan, Henderson, Farabow, Garrett & Dunner, L.L.P.

(57) ABSTRACT

One embodiment provides a semiconductor integrated circuit, including: a first input wire; a second input wire; a first look-up table (LUT) comprising: a plurality of first memories; a first number of first switches connected to the first input wire; and a second number of second switches connected to the second input wire, the second number being less than the first number, the first LUT being configured to output information which is stored in one of the first memories; and a second LUT including: a plurality of second memories; a third number of third switches connected to the second input wire; and a fourth number of fourth switches connected to the first input wire, the fourth number being less than the third number, the second LUT being configured to output information which is stored in one of the second memories.

13 Claims, 17 Drawing Sheets

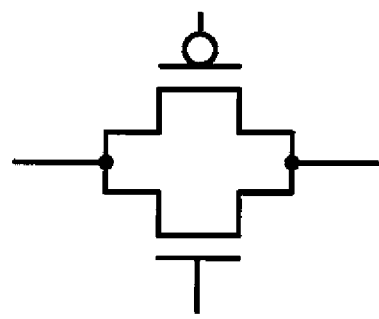
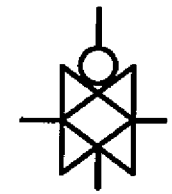
*FIG. 3A*          *FIG. 3B*

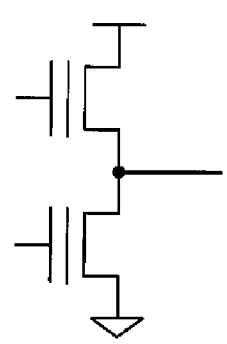
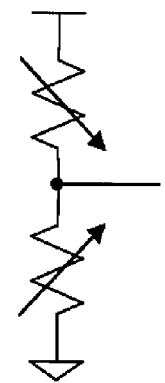
*Fig. 13A*  *Fig. 13B*
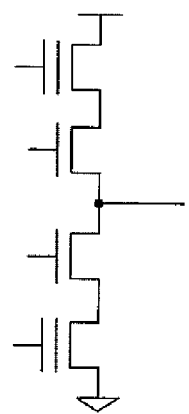
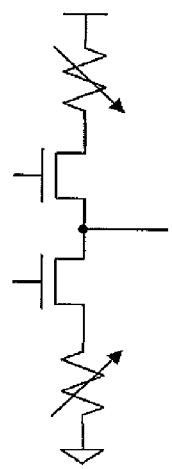
*Fig. 13C*  *Fig. 13D*
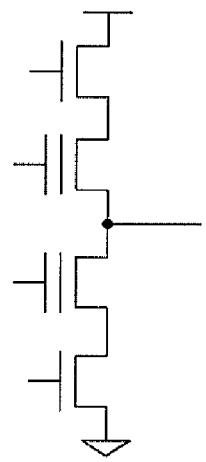
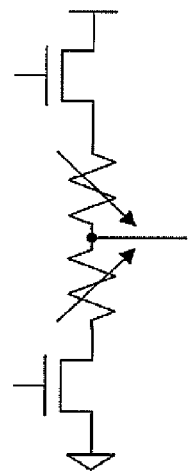
*Fig. 13E*  *Fig. 13F*

SEMICONDUCTOR INTEGRATED CIRCUIT

CROSS-REFERENCE TO RELATED APPLICATION(S)

This application claims priority/priorities from Japanese Patent Application No. 2012-072515 filed on Mar. 27, 2012, the entire contents of which are incorporated herein by reference.

FIELD

Embodiments described herein relate generally to semiconductor integrated circuits.

BACKGROUND

Reconfigurable integrated circuits (ICs), such as field programmable gate arrays (FPGAs), can reconfigure circuits to thereby implement arbitrary logic functions. A reconfigurable IC includes logic blocks and wiring portions. The logic blocks respectively implement arbitrary truth tables, and the wiring portions change the interconnection among the logic blocks. For example, look-up tables (LUTs) are used as elements for respectively configuring logic blocks, and switches are provided in the wiring portions. Data of the LUTs and data for switching connection/non-connection of the switches are stored in memories. The user can implement arbitrary logic-functions by appropriately writing information into the memories.

For example, in an LUT for implementing an N-input 1-output logic-circuit ("N" is a positive integer), $2^N$ memories are provided. To realize the logical operation represented by a given truth table, data corresponding to outputs of the given truth table are written into the $2^N$ memories. Then, the LUT outputs an appropriate signal by selecting one of the $2^N$ memories according to inputs thereto. Here, as the number of inputs to the LUT increases, delay in output thereof increases.

BRIEF DESCRIPTION OF DRAWINGS

FIGS. 3A and 3B illustrate examples of a switch.
FIGS. 13A to 13F and 14 illustrate examples of a memory.

DETAILED DESCRIPTION

Hereinafter, embodiments are described with reference to the drawings.

[First Embodiment]

Figure 1:
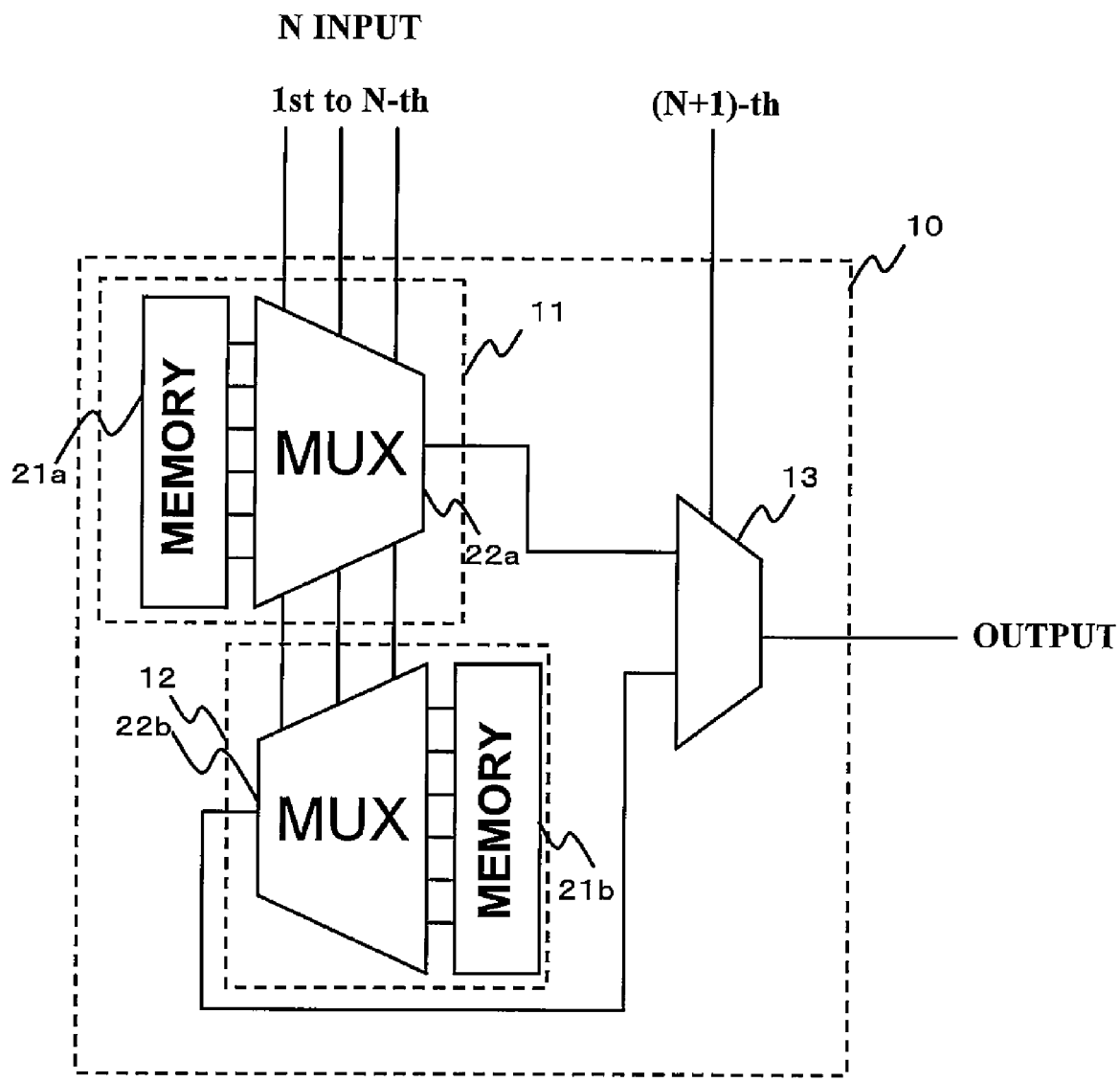
FIG. 1 schematically illustrates an LUT according to a first embodiment.

FIG. 1 illustrates an LUT according to a first embodiment. The LUT 10 illustrated in FIG. 1 is an (N+1)-input LUT. The LUT 10 includes two LUTs 11 and 12 and a multiplexer 13. Each of the LUTs 11 and 12 is less in the number of inputs than the LUT 10. The following description is made by assuming that each of the LUTs 11 and 12 is an N-input LUT. Thus, the N-input LUT 11 includes a memory group 21a of $2^N$ memories and a multiplexer 22a, and selectively outputs information stored in the memory group 21a using N input signals. The N-input LUT 12 includes a memory group 21b of $2^N$ memories and a multiplexer 22b, and selectively outputs information stored in the memory group 21b using N input signals.

The N-input LUTs 11 and 12 are connected to the N input signal wires, and output signals of the N-input LUTs 11 and 12 are input to the multiplexer 13. One of the output signals input to the multiplexer 13 is selected to be output according to an (N+1)-th input signal. Consequently, an (N+1)-input 1-output LUT 10 can be implemented. Here, a direction of connecting the N-input LUT 11 to the N input signal wires is opposite to a direction of connecting the N-input LUT 12 to the N input signal wires.

By making the connection directions of the N-input LUTs 11 and 12 with respect to the N input signal wires to be opposite to one another, loads of the N input signal wires can be uniformized. Accordingly, a delay time from the input of each input signal to the output of the selected signal can be reduced. This effect is described hereinafter with reference to a circuit example of the LUT 10.

Figure 2:
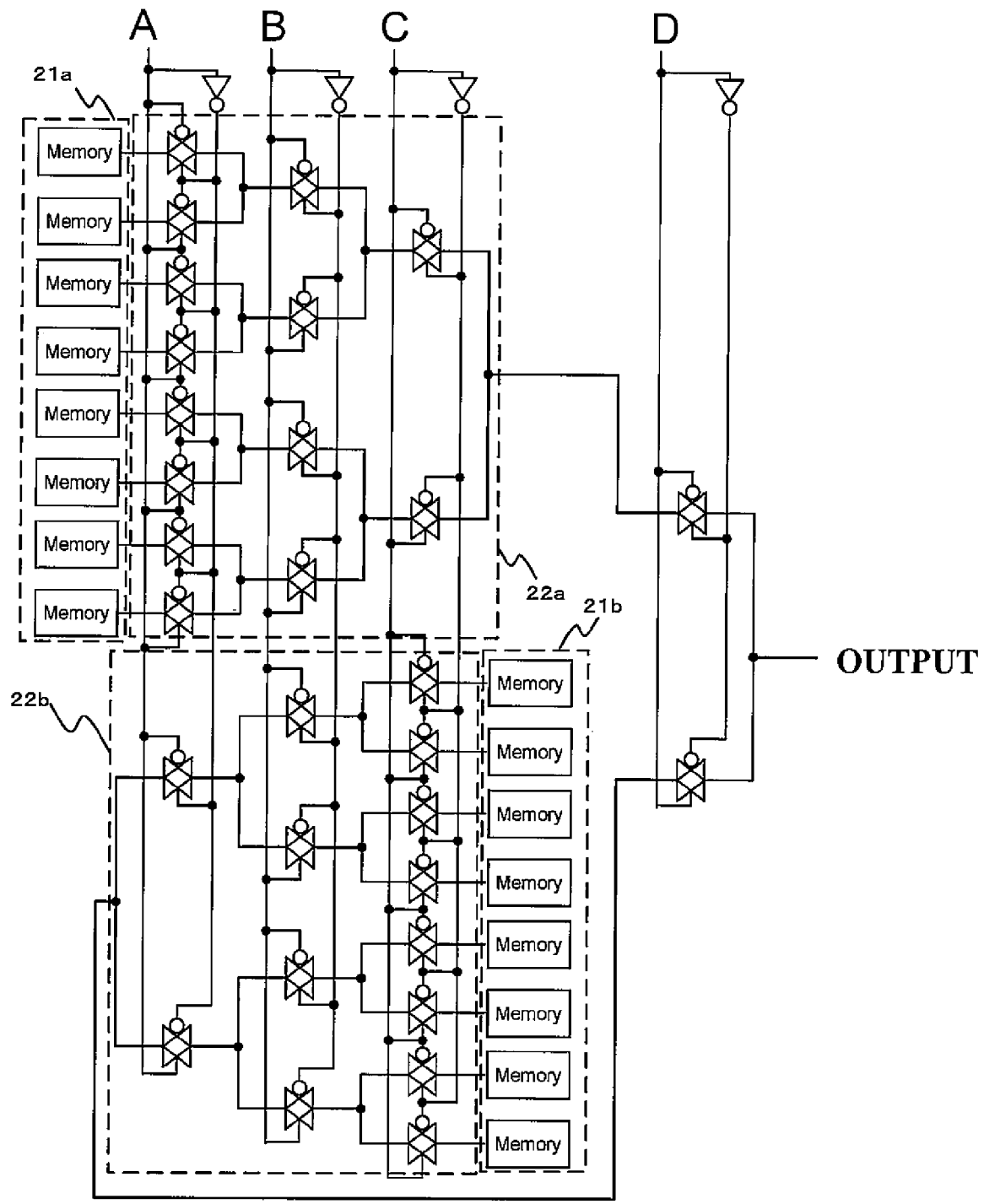
FIG. 2 illustrates a circuit example of the LUT according to the first embodiment.

FIG. 2 illustrates a circuit example of the LUT 10. The LUT 10 illustrated in FIG. 2 is a 4-input LUT. The LUT 10 configures multiplexers 13, 22a and 22b using plural switches. In the case of the 4-input LUT 10, 3 input wires A, B and C are connected to each of the multiplexers 22a and 22b, and 3 input signals A, B and C are input to the 3 input wires A, B and C, respectively.

Figure 4:
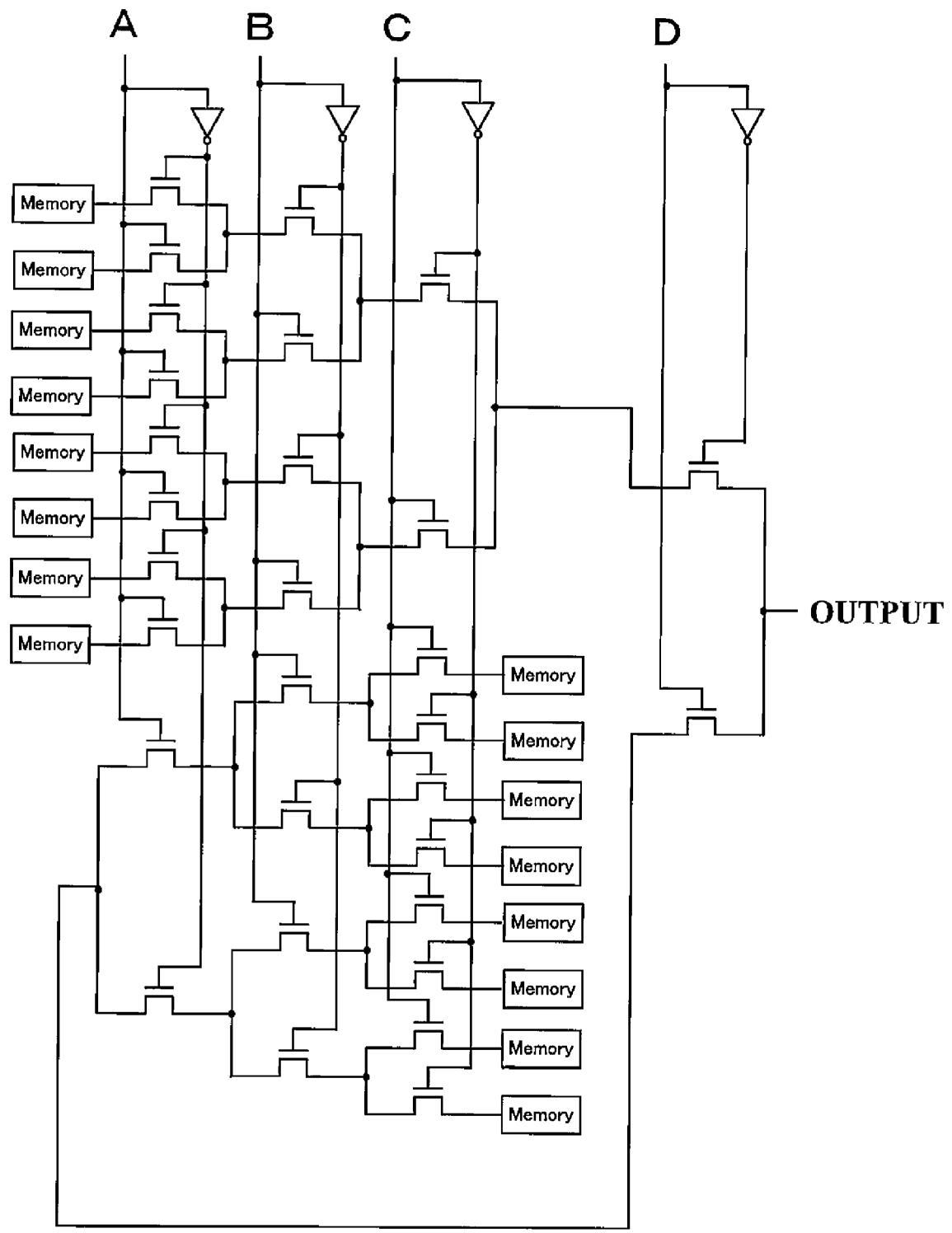
FIG. 4 illustrates another circuit example of the LUT according to the first embodiment.

As illustrated in FIG. 3A, e.g., a transfer gate configured by a parallel combination of an N-channel metal oxide semiconductor (NMOS) transistor and a P-channel metal oxide semiconductor (PMOS) transistor can be used as each of the transistors. Incidentally, in FIG. 2 and later, the transfer gate is designated with a symbol illustrated in FIG. 3B. Alternatively, as illustrated in FIG. 4, either an NMOS transistor switch or a PMOS transistor switch can be used as each of the switches of the LUT 10. The memories of the memory groups 21a and 21b may be either volatile memories or nonvolatile memories.

The memories of the memory group 21a are connected to a switch that is connected to the input wire A, whereas the memories of the memory group 21b are connected to a switch that is connected to the input wire C. As illustrated in FIG. 2, the stages of the multiplexers 22a and 22b having the largest number of switches are connected to the input wires A and C that are closest to the memory groups 21a and 21b, respectively. Two switches are connected to the closest to output terminals of the multiplexers 22a and 22b, respectively. Thus, by making the direction of connecting the multiplexer 22a to the input wires A to C and the direction of connecting the multiplexer 22b to the input wires A to C to be opposite to one another, the number of the switches of the multiplexer 22a, which are connected to the input wire A, is larger than the number of the switches of the multiplexer 22a, which are connected to the input wire C, while the number of switches of the multiplexer 22b, which are connected to the input wire A, is smaller than the number of the switches of the multiplexer 22b, which are connected to the input wire C. Consequently, the loads on the input wires can be uniformized.

Figure 5:
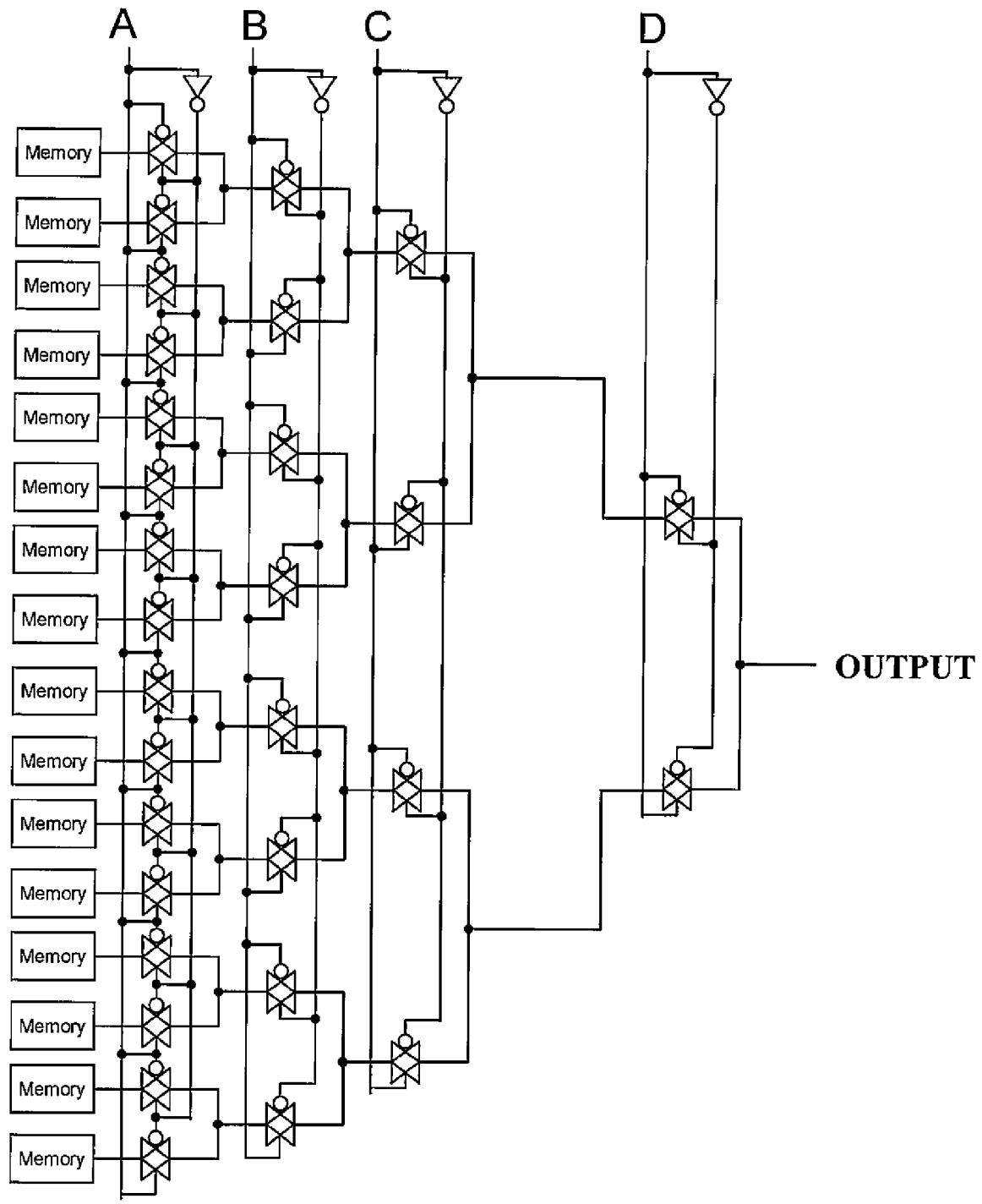
FIG. 5 illustrates an LUT according to a comparative example.

For example, if the direction of connecting the multiplexer 22a to the input wires and the direction of connecting the multiplexer 22b to the input wires are the same, as indicated in a comparative example illustrated in FIG. 5, the number of switches driven by signals input from the closest input wire (i.e., the input wire A) to each of the memory groups are 16.

On the other hand, in the case of the LUT 10 illustrated in FIG. 2, the number of switches driven by the input signal A is 10. Thus, time taken to charge and discharge the switch through the wire from which the signal A is input is shortened. Consequently, the delay time of the LUT can be shortened.

If the connection directions of the multiplexers 22a and 22b with respect to the input wires are the same, the number of switches connected to the closest input wire (i.e., the input wire A) to the memory group is twice or more the number of switches connected to the other input wires. Therefore, load is concentrated onto the closest input wire to the memory group. Delay time from the input of an input signal to the switch connected to this input wire to the output of the input signal is longer than the delay time of other switches. Thus, circuit delay has considerably changed depending on whether the critical path of the circuit uses the closest input wire to the memory group.

On the other hand, in the LUT 10 illustrated in FIG. 2, the number of switches driven by an input signal A is 10. The number of switches driven by an input signal B is 8. The number of switches driven by an input signal C is 10. Thus, the loads on the input wires can be uniformized. Consequently, the necessity of considering the balance of loads on input terminals at the configuration of the circuit is reduced.

In the first embodiment, memory data stored in the memories of the memory group 21a is set so as to differ in the order of values from that stored in the memories of the memory group 21b. As illustrated in FIG. 2, the memory group 22b is configured by reversing the memory group 22a. Data arranged considering the above-mentioned relationship are stored in the memory groups 21a and 21b. That is, the following data are respectively stored in the memories of the memory group 21a, from the top, as viewed in FIG. 2.

[Expression 1]

$\overline{A} \wedge \overline{B} \wedge \overline{C}, \overline{A} \wedge \overline{B} \wedge C, \overline{A} \wedge B \wedge \overline{C}, A \wedge \overline{B} \wedge \overline{C}, \overline{A} \wedge B \wedge C, A \wedge \overline{B} \wedge C, \overline{A} \wedge B \wedge C,$ and $A \wedge B \wedge C$.

On the other hand, the following data are respectively stored in the memories of the memory group 21b, from the top, as viewed in FIG. 2.

[Expression 2]

$\overline{A} \wedge \overline{B} \wedge \overline{C}, \overline{A} \wedge \overline{B} \wedge C, \overline{A} \wedge B \wedge \overline{C}, A \wedge \overline{B} \wedge \overline{C}, A \wedge \overline{B} \wedge C, \overline{A} \wedge B \wedge C, A \wedge B \wedge \overline{C},$ and $A \wedge B \wedge C$.

Each overbar represents logical negation. For example, low voltage level is assigned to logical negation. The data respectively stored in the memories of the memory group 21 a, which are sequentially arranged from the top, differ in arrangement-sequence from the data respectively stored in the memories of the memory group 21b, which are sequentially arranged from the top. However, all the possible values represented by the data stored in the memories of the memory group 21a correspond to those represented by the data stored in the memories of the memory group 21b, respectively. The LUT 10 serves as a 4-input LUT by selecting which of the memory groups 21a and 21b corresponds to each of an input from the wire D and the logical negation of this input. On the other hand, in the case of a comparative example illustrated in FIG. 5, the arrangement-sequence determined according to input signals A, B and C is the same between a memory group illustrated at an upper portion and a lower memory group illustrated at a lower portion.

[First Modification]

Figure 6:
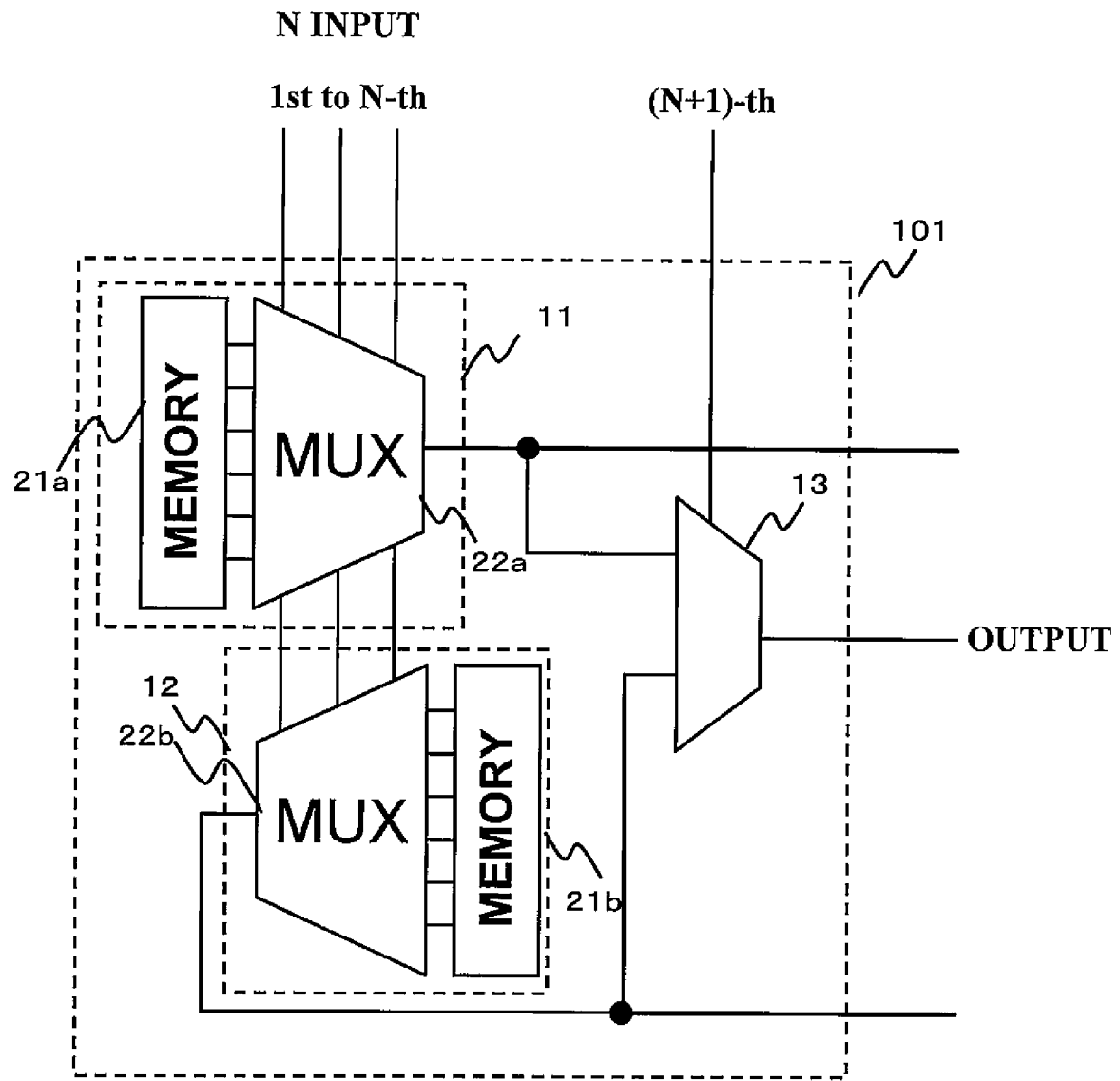
FIG. 6 illustrates a first modification of the first embodiment.

FIG. 6 illustrates a first modification of the first embodiment. An (N+1)-input LUT 101 further includes wires for inputting, to an external circuit, signals output from two N-input LUTs 11 and 12. Consequently, the LUT 101 can be used as either an (N+1)-input LUT or two N-input LUTs.

[Second Modification]

Figure 7:
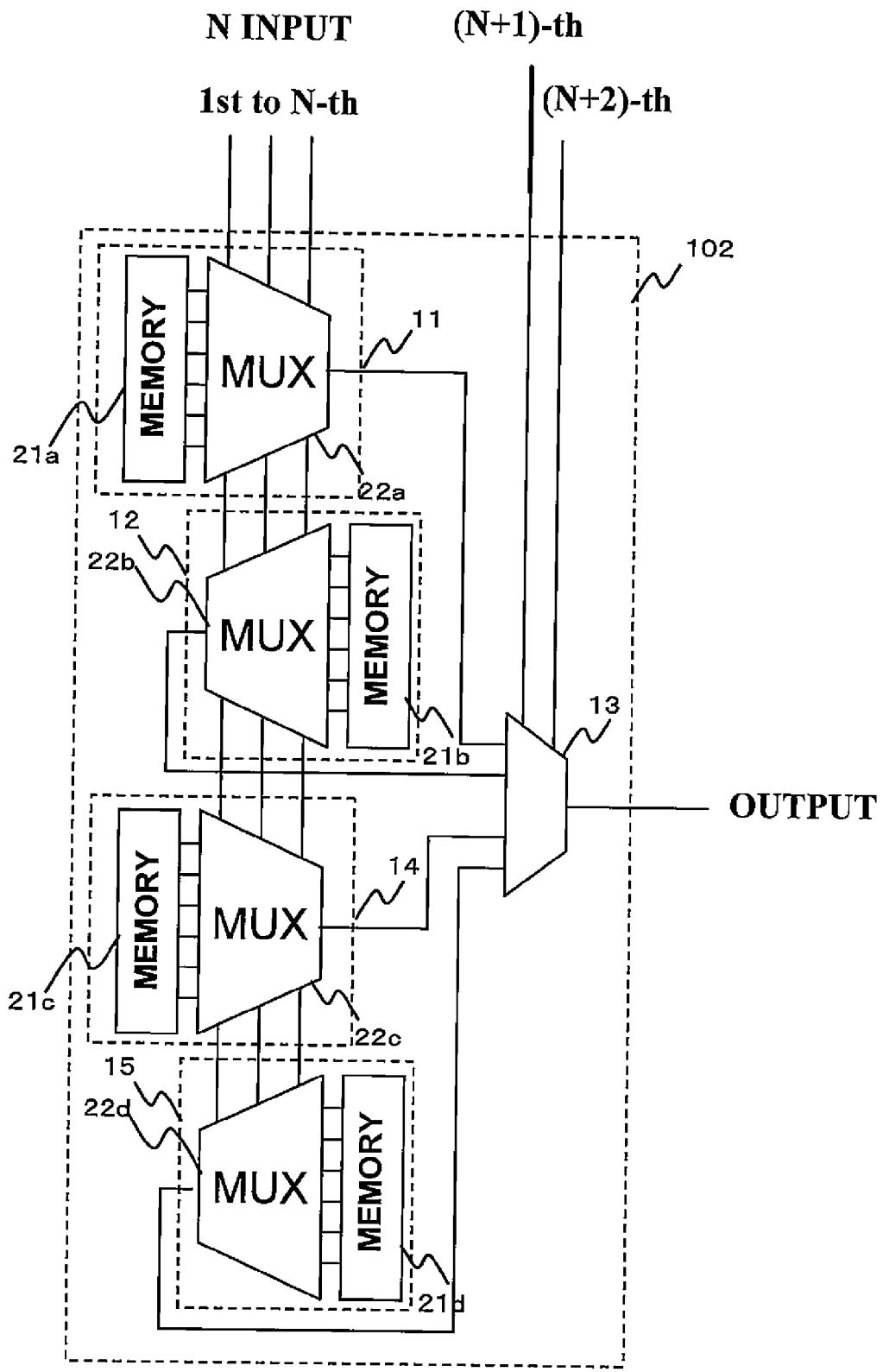
FIG. 7 illustrates a second modification of the first embodiment.

FIG. 7 illustrates a second modification of the first embodiment. An (N+2)-input LUT 102 includes four N-input LUTs 11, 12, 14 and 15. The connection directions of the LUTs 11 and 14 with respect to input wires are opposite to the connection directions of the LUTs 12 and 15 with respect to the input wires. Thus, an i-input LUT ("i" is a positive integer) may be configured by three or more j-input LUTs ("j" is a positive integer and less than the integer "i"). The number of the LUTs connected to the input wires in a first connection direction is not necessarily the same as the number of the LUTs connected to the input wires in a second connection direction that is opposite to the first connection direction.

The more largely the number of the j-input LUTs configuring the i-input LUT is increased, the more uniform the balance of loads on the input wires becomes. Consequently, whatever input wire the critical path of the circuit uses, the variation of the delay time of the LUT is reduced.

[Third Modification]

Figure 8:
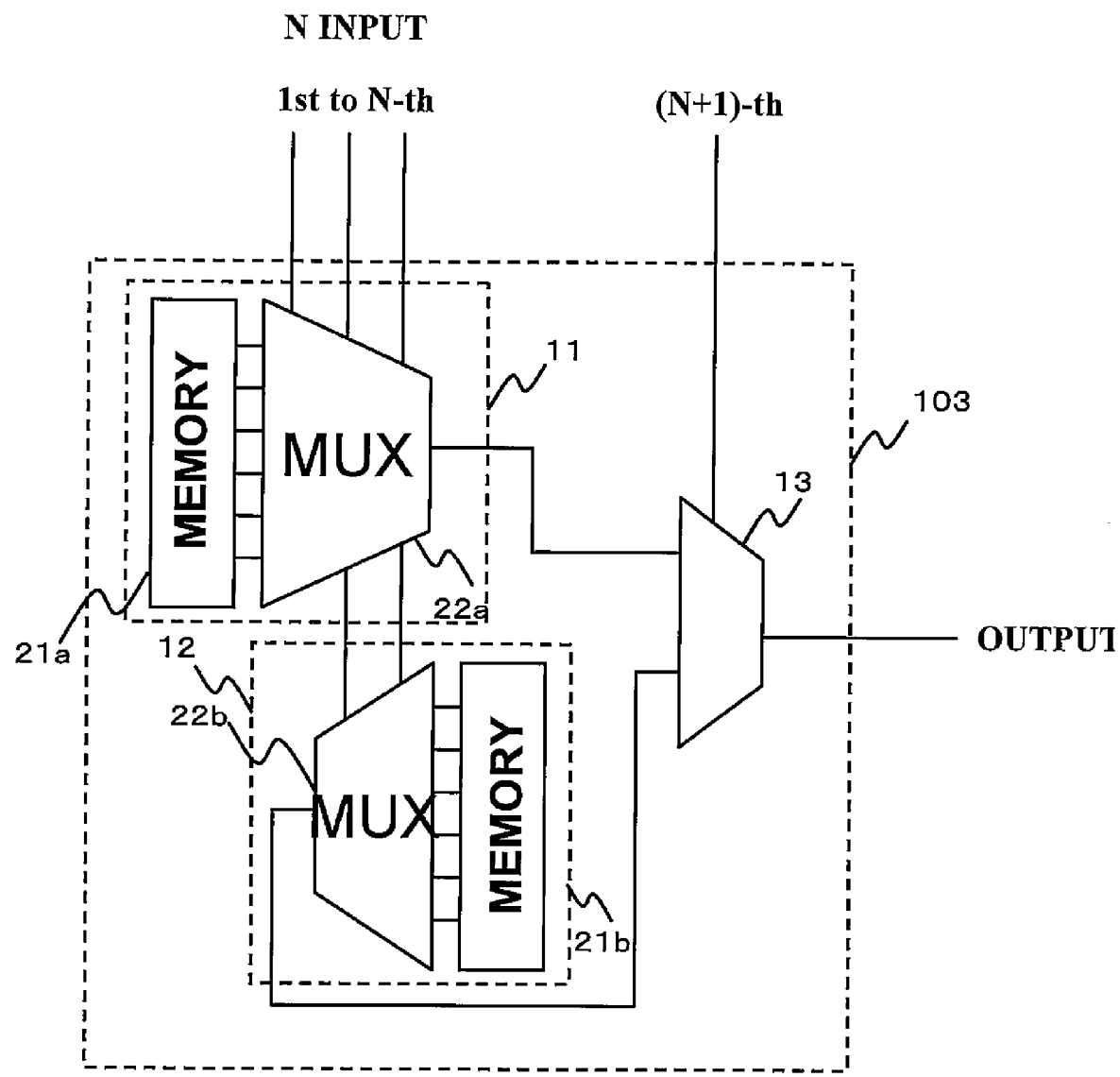
FIGS. 8 and 9 illustrate a third modification of the first embodiment.

FIG. 8 illustrates a third modification of the first embodiment. An LUT 103 includes an N-input LUT 11 and an M-input LUT 12 ("M" is a positive integer) configured such that M is less than N. In the case of combining LUTs differing in size from one another, preferably, the small-size LUT 12 is connected to the input wires which are connected to switches close to the output terminal of the large-size LUT 11, among input wires to which the large-size LUT 11 is connected. This is because of the facts that a load on the input wire connected to the switch close to the output terminal of the large-size LUT 11, which is caused due to the switch of the large-size LUT 11, is small, and that even if the LUT 12 is connected such an input wire, load on the input wire is suppressed.

Figure 9:
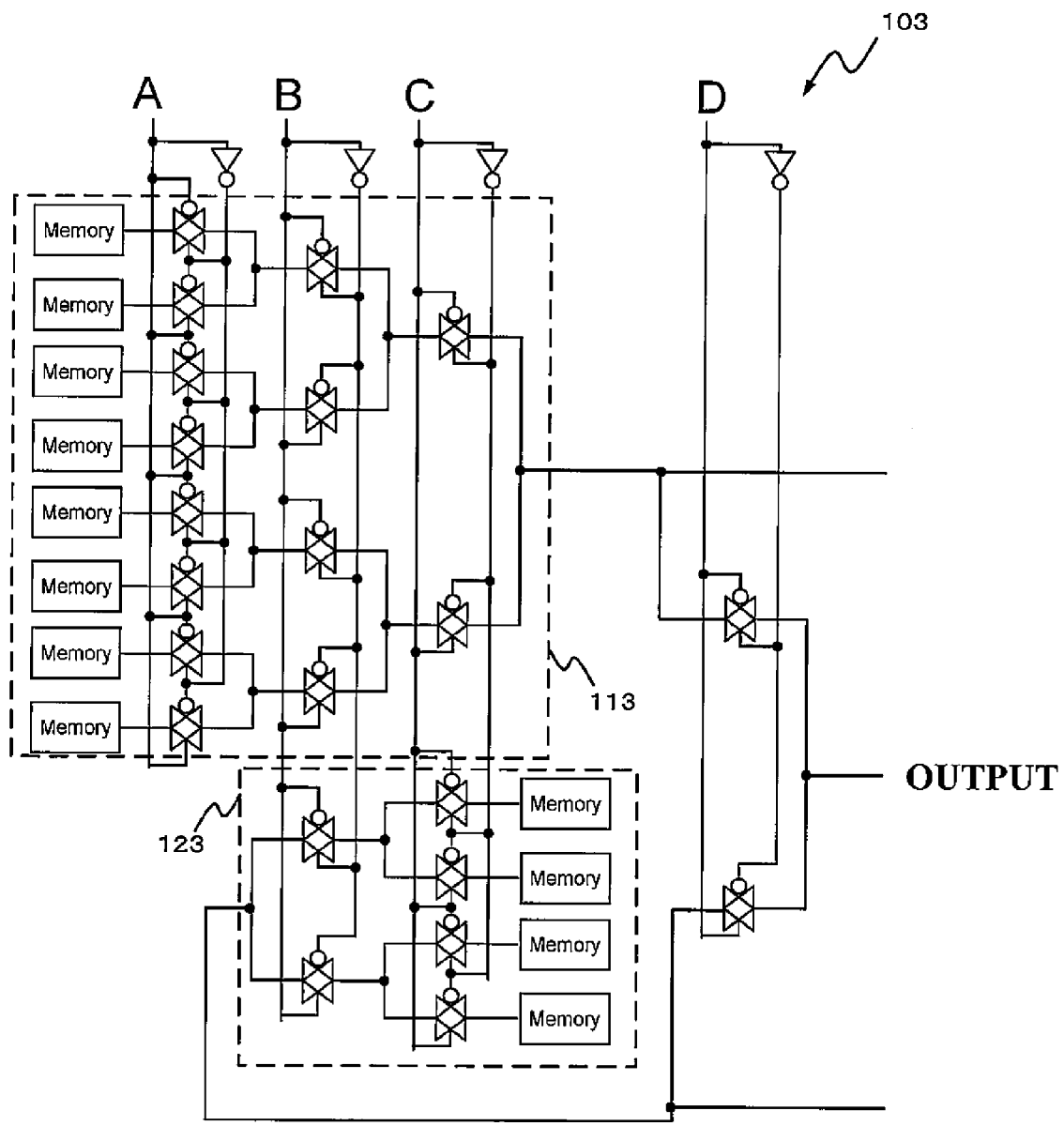

FIG. 9 illustrates the case of combining a 3-input LUT and a 2-input LUT. Even in the LUT 103 illustrated in FIG. 9, the switches may be transfer gates, NMOS transistors, or PMOS transistors. Assuming that the input wires of the 3-input LUT 113 are an input wire A, an input wire B, and an input wire C, the input wire A is connected to a switch that is connected to the memory of the 3-input LUT 113. The input wire C is connected to a switch that is connected to an output of the 3-input LUT 113. A 2-input LUT 123 is connected to the input wire B and the input wire C. The 2-input LUT 123 can be connected to the input wires A and B, or to the input wires A and C. However, because the wire A is the input wire to which the largest number of switches of the 3-input LUT 113 are connected, the load on the wire A is large. Thus, the load on the wire A is large. Therefore, a lowest load circuit configuration for the LUT 103 is obtained by connecting the 2-input LUT 123 to the input wire B and the input wire C. In addition, the loads on the input wires are substantially equal to one another. Thus, configuration with small variation of the delay time can be implemented. Incidentally, this modification employs the combination of the 3-input LUT and the 2-input LUT by way of example. However, LUTs each having an optional number of inputs can be used.

[Fourth Modification]

Figure 10:
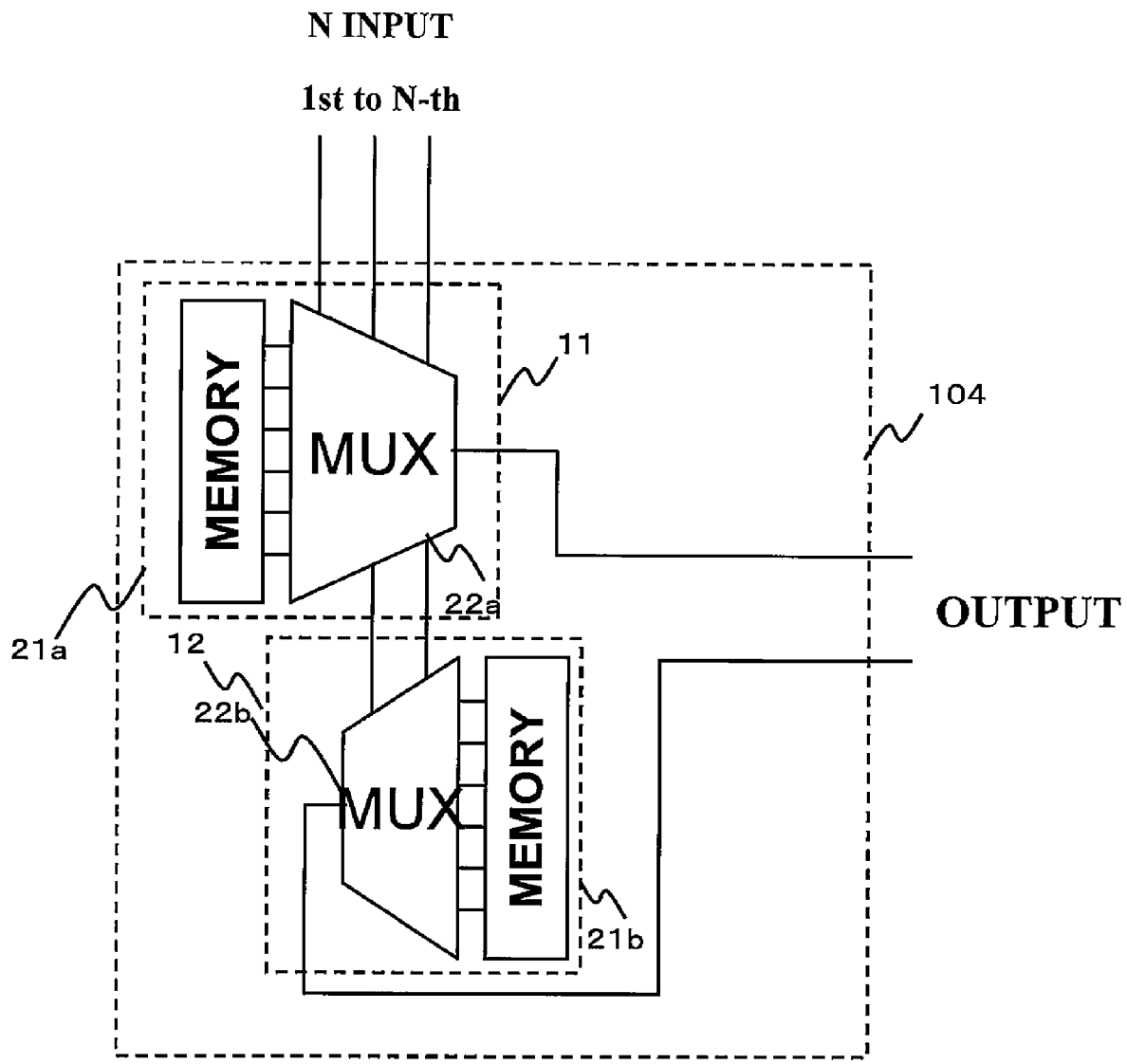
FIG. 10 illustrates a fourth modification of the first embodiment.

FIG. 10 illustrates a fourth modification of the first embodiment. In an LUT 104, signals output from the LUTs 11 and 12 are input to an external circuit, instead of selecting one of outputs of the LUT 11 and the LUT 12 with a multiplexer. For example, in the case of configuring an adder, an output therefrom is surely represented by plural bits. In this case, it is unnecessary that one of outputs from plural LUTs is selected by a multiplexer. Thus, since the LUT 104 can be configured without providing a multiplexer therein, the area of the circuit and the power consumption thereof can be reduced.

The above modifications may be combined with one another. For example, an i-input LUT may be configured by three or more j-input LUTs, and a wire for inputting, to an external circuit, three or more j-input LUTs may be added. At that time, a multiplexer for selecting one of output signals from the j-input LUTs is not necessarily provided. In addition, the plural LUTs may differ in the number of inputs from one another.

[Second Embodiment]

Figure 11:
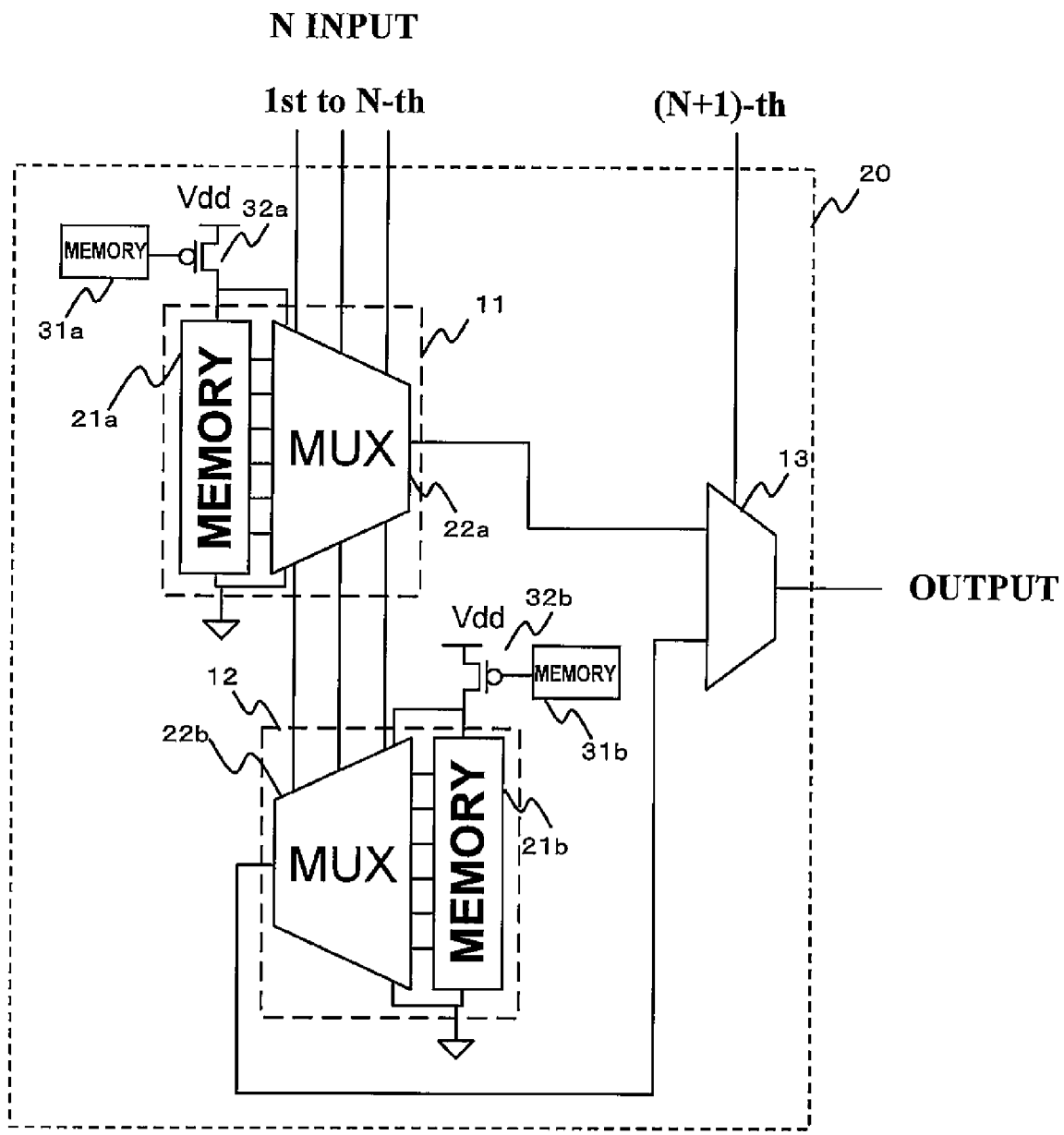
FIG. 11 schematically illustrates an LUT according to a second embodiment.

FIG. 11 illustrates an LUT 20 according to a second embodiment. The LUT 20 is configured such that PMOS power-supply-control switches 32a and 32b are connected to the memory groups 21a and 21b, respectively. Power-supply-control memories 31a and 31b are connected to the gates of the power-supply-control switches 32a and 32b, respectively. In the case of the LUT 20 illustrated in FIG. 11, the power-supply-control switches 32a and 32b are provided between the power supply wire and the memory group 21a and between the power supply wire and the memory group 21b, respectively. However, a PMOS power-supply-control switch may be provided between the power supply wire and each of the memory groups 21a and 21b. In addition, an NMOS power-supply-control switch may be provided between the ground wire and each of the memory groups 21a and 21b. The power-supply-control switch may be provided only between the power supply wire and the memory group. Alternatively, the power-supply-control switch may be provided only between the memory group and the ground wire. The power supply wire and the ground wire may be referred correctively to as the power-supply/ground wire. The LUTs 11 and 12 and the multiplexer 13 may be configured similarly to those according to the first embodiment.

Thus, the power supply to the LUTs 11 and 12 may be interrupted by providing the power-supply-control switches. For example, in a case where the LUT 20 is not used, the power consumption of the entire LUT 20 can be reduced by shutting off both of the power-supply-control switches 32a and 32b.

For example, in the case of using the (N+1)-input LUT 20 as an N-input LUT, an output of a predetermined one (e.g., the LUT 11) of the N-input LUTs 11 and 12 is selected by the multiplexer 13. The selected signal is output from the LUT 20. Thus, the (N+1)-input LUT 20 as an N-input LUT. At that time, it is unnecessary to use the LUT 12. Then, the power supply to the power-supply-control switch 32b is interrupted. Consequently, power consumption can be reduced.

Figure 12:
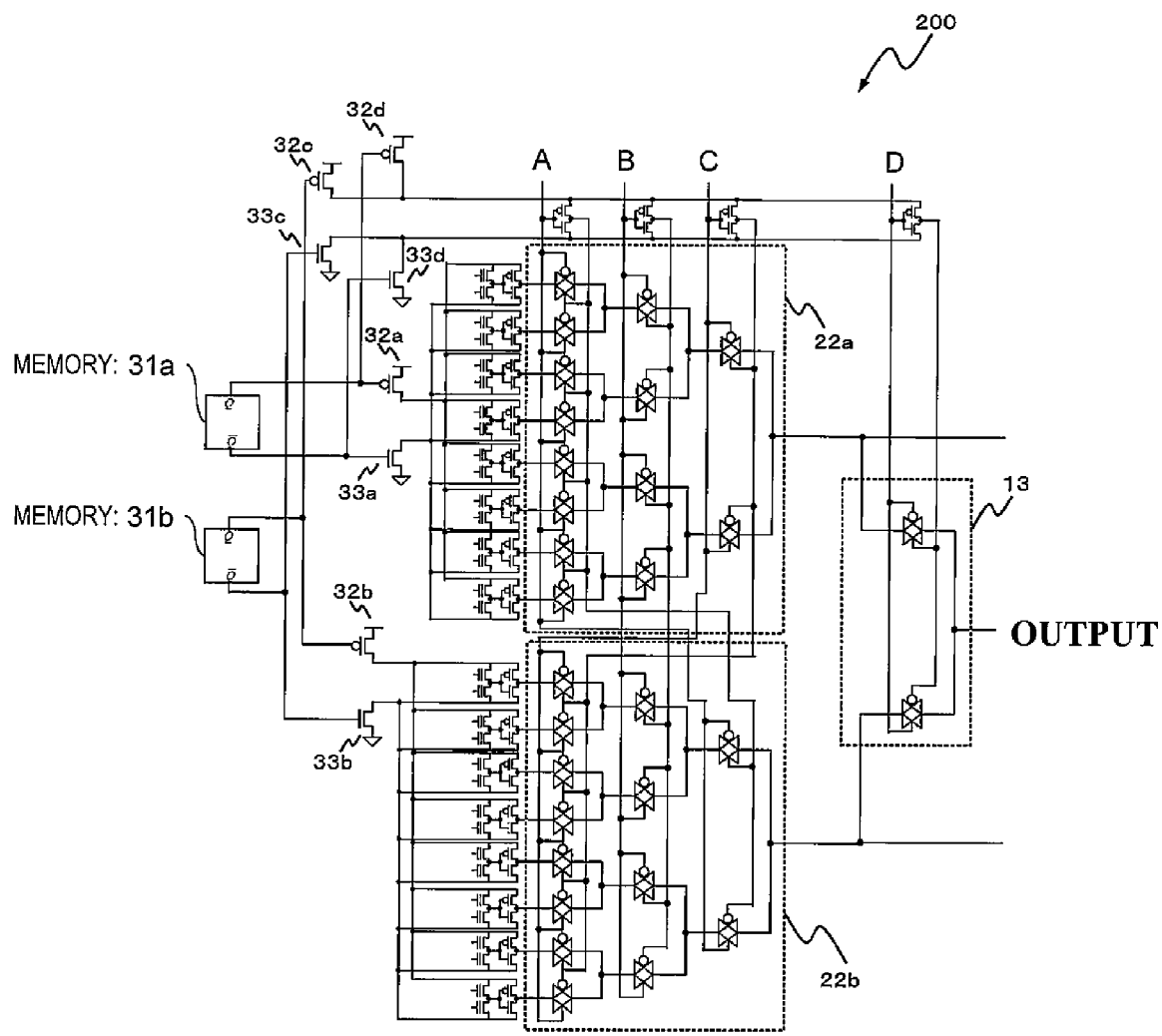
FIG. 12 illustrates another example of the LUT according to the second embodiment.

Incidentally, FIG. 11 illustrates the LUT in which the power supply to the multiplexer 22a and the power supply to the multiplexer 22b are controlled according data stored in the power-supply-control memories 31a and 31b, respectively, independent of each other. However, the power supply to both of the multiplexers 22a and 22b may be controlled in common according to data stored in the power-supply-control memories 31a and 31b. FIG. 12 illustrates such LUT 200. In the LUT 200, if "1" is stored in the power-supply-control memory 31a, the power-supply-control switches 32a and 33a are put into an off-state. Thus, the power supply to the memories connected to the power-supply-control switches 32a and 33a is shut off. If "1" is stored in the power-supply-control memory 31b, the power-supply-control switches 32b and 33b are brought into an off-state. Thus, the power supply to the memories connected to the power-supply-control switches 32b and 33b is shut off. In the LUT 200, inverters provided on the input wires A, B, and C are shared by the multiplexers 22a and 22b. Power-supply-control switches 32c, 33c, 32d and 33d are connected to inverters provided on the input wires A, B, C and D. The power-supply-control switches 32c and 33c are put into an off-state, if "1" is stored in the power-supply-control memory 31b. The power-supply-control switches 32d and 33d are brought into an off-state, if "1" is stored in the power-supply-control memory 31a. That is, the power supply to the inverters provided on the input wires A, B, C, and D is shut off if "1" is stored in both of the power-supply-control memories 31a and 31b. Thus, the power supply to the multiplexers 22a, 22b and 13 provided in the LUT 200 can be shut off.

As illustrated in FIGS. 11 and 12, the power-supply-control memories 31a and 31b and the power-supply-control switches 32a and 32b for all LUT (i.e., the LUTs 11 and 12) configuring the LUT 20 are provided. However, the power-supply-control memories and the power-supply-control switches are not necessarily provided for all the LUTs. The LUT 20 may be configured such that if one of the LUTs 11 and 12 is always used, no power-supply-control memory and no power-supply-control switches are provided for the one of the LUTs, and that the other LUT 12 or 11 is provided with a power-supply-control memory and a power-supply-control switch.

Thus, if both of the LUTs 11 and 12 are used in the LUT 20, the delay of the circuit is reduced because the connection directions of the LUTs 11 and 12 with respect to the input wires are made to be opposite to one another. In addition, the power supply to at least one of the LUTs 11 and 12 can be shut off. Thus, the power consumption can be reduced.

The memories of the memory groups 21a and 21b may be either volatile memories or nonvolatile memories. Alternatively, both of volatile and nonvolatile memories may be used as the memories of the memory groups 21a and 21b. However, if nonvolatile memories are used as the memories of the memory groups 21a and 21b, the power supply can be shut off even during operation of the LUT 20.

Figure 14:
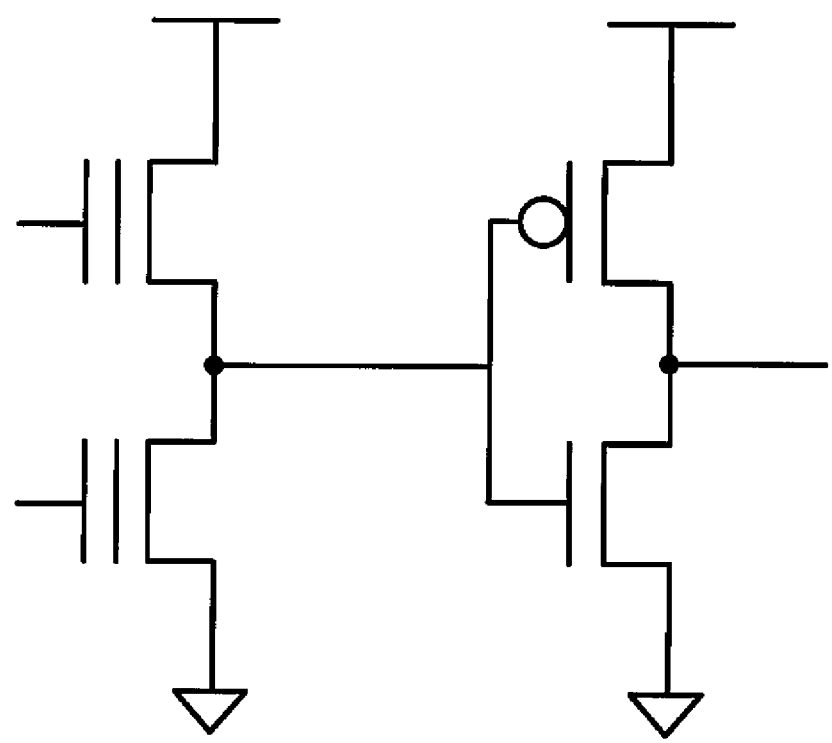

As illustrated in FIGS. 13A and 13B, a floating type flash memory, a charge-trap type metal-oxide-nitride-oxide-semiconductor (MONOS) memory, a phase-change memory, MRAM, an ionic memory, and a resistance change type memory such as a resistance random access memory (ReRAM) can be employed as the nonvolatile memory. Further, as illustrated in FIGS. 13C, 13D, 13E and 13F, selection transistors, such as NMOS transistors, PMOS transistors and transfer gates, may be used in combination with the above nonvolatile memories. If the drive power of the memory is low, the drive power can be increased by connecting a buffer, such as a complementary metal-oxide semiconductor (CMOS) inverter, to an output terminal of the memory, as illustrated in FIG. 14. Incidentally, in the case described with reference to FIGS. 13A, 13B and 14, the power supply wire is connected to one of two memories, while the ground wire is connected to the other memory. These figures illustrate a state at the time of causing the LUTs to operate. In addition, a programming power supply and a control circuit, which are used to write and erase data to and from each element, are connected to the memories, though this power supply and this control circuit are not illustrated.

As an example of interrupting the power supply during operation of the LUT 20, the following case may be considered. That is, it is obvious or expected that only the LUT 11 is used and the LUT 12 is not used in a certain time period during operation of the LUT 20. In this case, the power supply to the LUT 12 is interrupted.

In addition, after a lapse of the certain time period in which the LUT 12 is not used, the power supply to the LUT 12 is restored.

Figure 15:
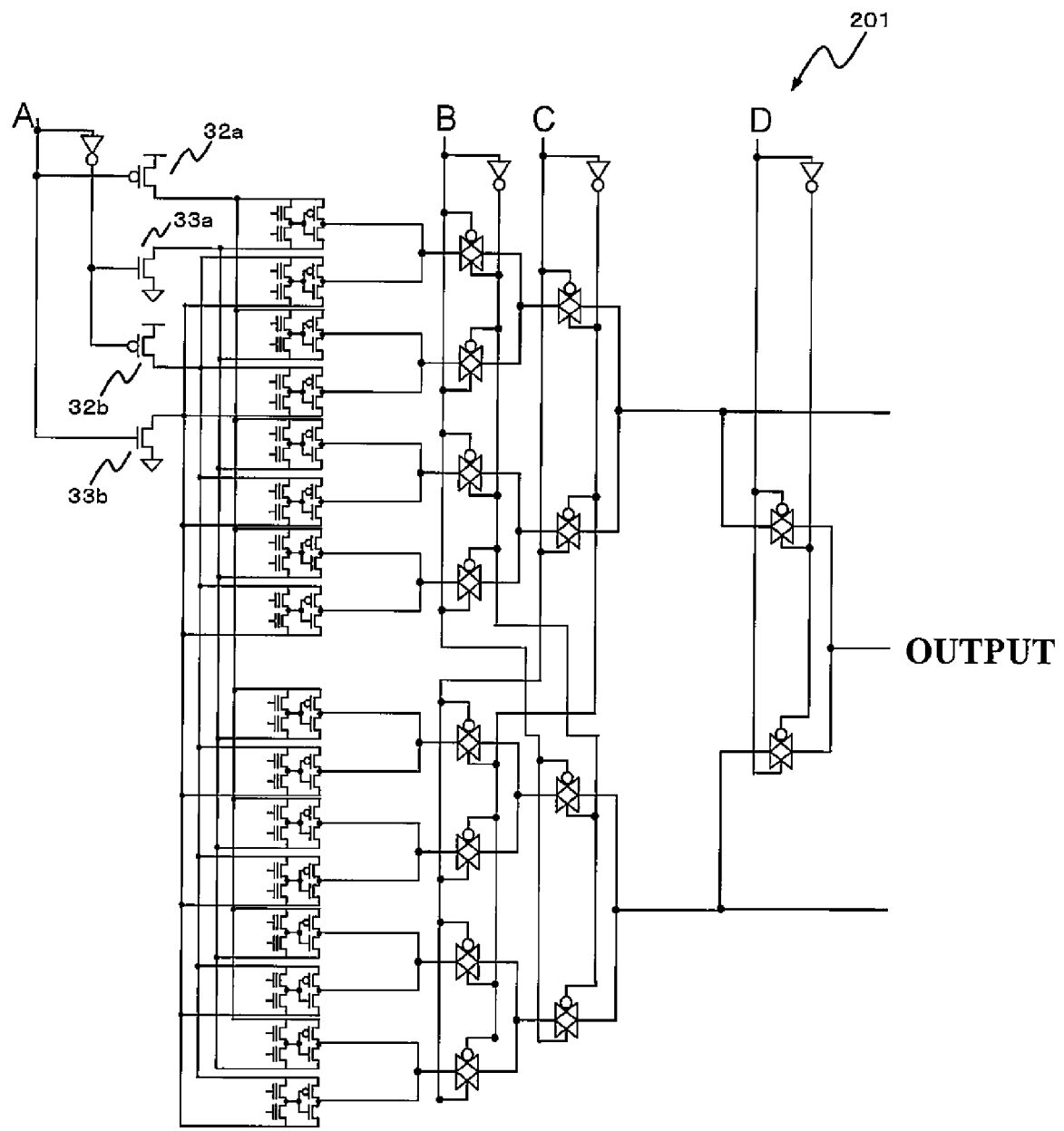
FIGS. 15 to 17 each illustrates still another example of the LUT according to the second embodiment.

The power supply to a part of an LUT may be interrupted using an input signal, as illustrated in FIG. 15. An LUT 201 includes two 3-input LUTs. 5. Power-supply-control switches 32a, 32b, 33a and 33b are provided on the input wire A of the LUT 201. Consequently, if an input signal A represents "1", the power-supply-control switches 32a and 33a are turned off. Thus, the power supply to memories connected to the power-supply-control switches 32a and 33a is shut off. At that time, the power-supply-control switches 32b and 33b are in an on-state. Therefore, power is supplied to memories connected to the power-supply-control switches 32b and 33b. On the other hand, if a signal input from the input wire A represents "0", the power-supply-control switches 32a and 33a are turned on, while the power-supply-control switches 32b and 33b are turned off. The number of memories connected to the power-supply-control switches 32a and 33a is a half the number of memories provided in the LUT 201. Memories connected to the power-supply-control switches 32b and 33b are the remaining half of the memories provided in the LUT 201. Thus, leakage current can be reduced by half by providing the power-supply-control switches 32a, 32b, 33a and 33b in the LUT 201.

In an example of FIG. 15, the input wire B functions as a first input wiring, the input wire C functions as a second input wiring, and the input wire A functions as a third input wiring. Although the power-supply-control switches are connected to the input wire A in FIG. 15, the power-supply-control switches may be connected to the input wires B, C, and D other than the input wire A. Whichever input-wire the power-supply-control switch is provided on, leakage current can be reduced by half.

Figure 16:
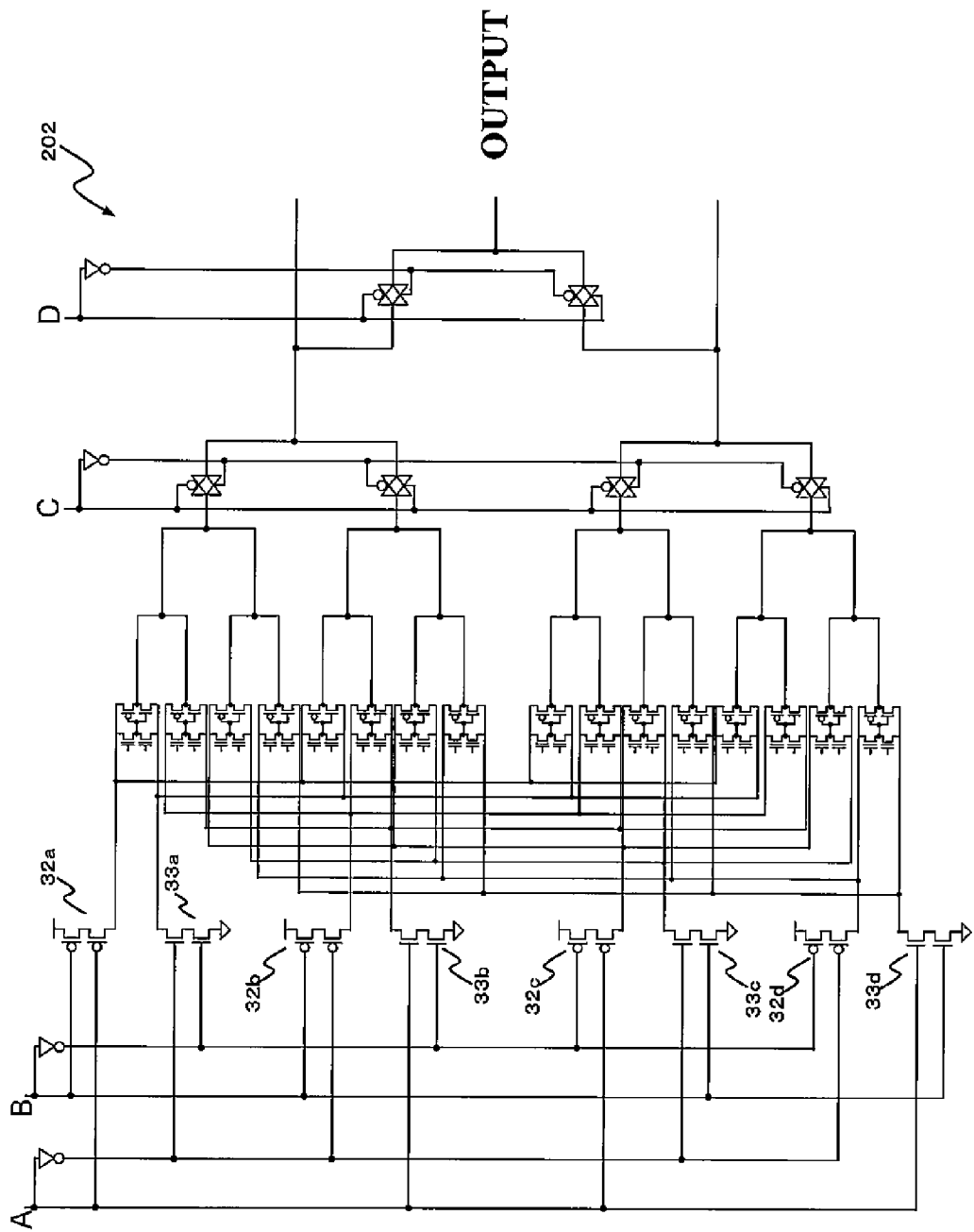

In addition, the power supply to a part of an LUT can be interrupted using plural input signals, as illustrated in FIG. 16. An LUT 202 is configured such that the power-supply-control switches 32a, 33a, 32b, 33b, 32c, 33c, 32d and 33d are connected to the input wire A and the input wire B. Each of the power-supply-control switches 32a, 32b, 32c and 32d is configured by series-connecting a PMOS transistor, whose gate is connected to the input wire A, and a PMOS transistor, whose gate is connected to the input wire B. Each of the power-supply-control switches 33a, 33b, 33c and 33d is configured by series-connecting an NMOS transistor, whose gate is connected to the input wire A, and an NMOS transistor, whose gate is connected to the input wire B.

Consequently, if the input signal A and the input signal B represent "1", the power-supply-control switches 32d and 33d are turned on. Other power-supply-control switches are turned off. Thus, one of a pair of the power-supply-control switches 32a and 33a, a pair of the power-supply-control switches 32b and 33b, a pair of the power-supply-control switches 32c and 33c, and a pair of the power-supply-control switches 32d and 33d is turned on according to the combination of values respectively represented by the input signal A and the input signal B. Other power-supply-control switches are turned off. Therefore, leakage current of the memory groups included in the LUT 202 may be reduced to ¼.

Figure 17:
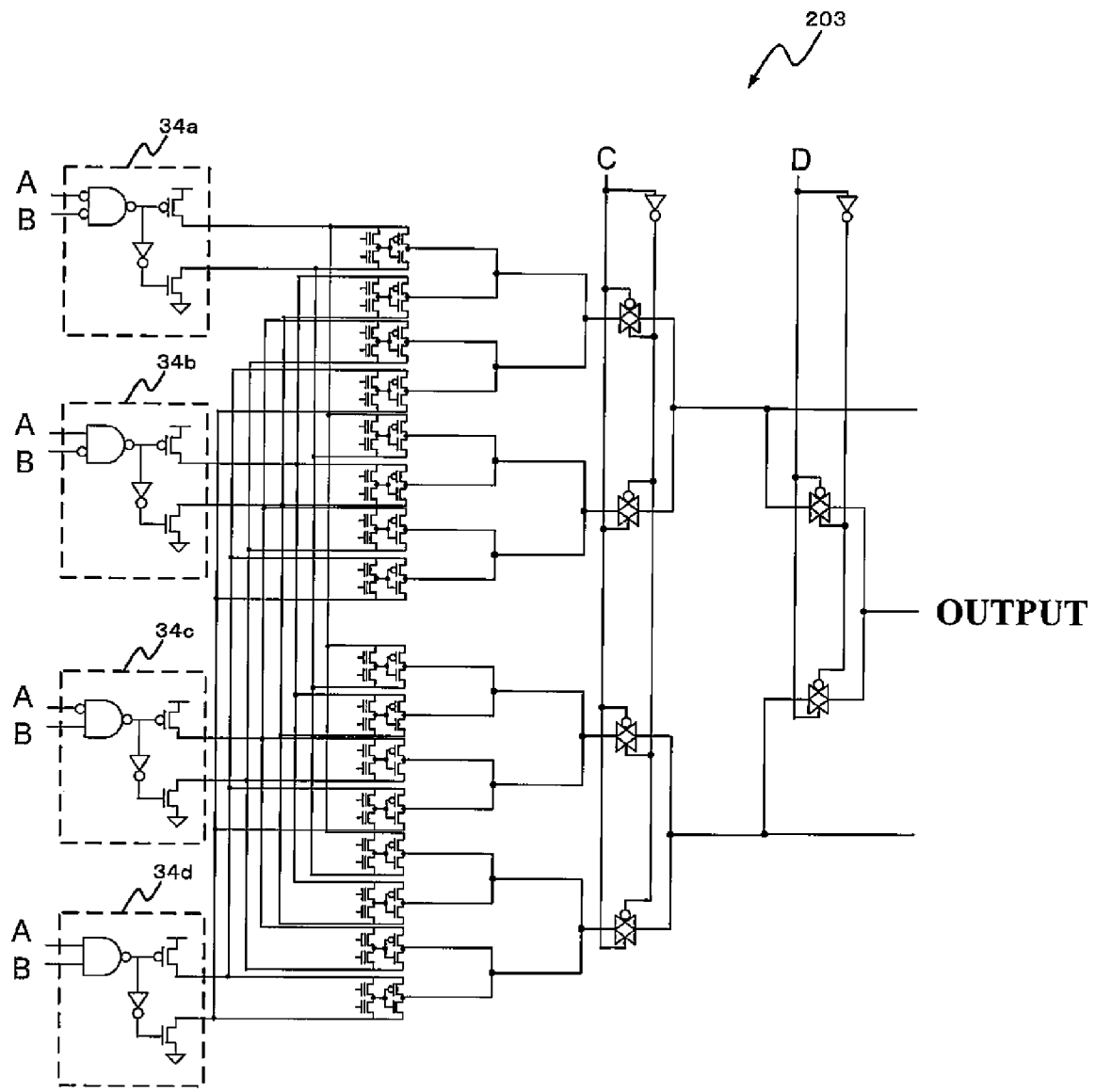

The power-supply-control switches illustrated in FIG. 16 can be configured using logic gates. FIG. 17 illustrates an example of an LUT in the case of configuring the power-supply-control switches using NAND-gates to control the power supply according to the combination of values respectively represented by the input signal A and the input signal B. An LUT 203 is configured such that one of the power-supply-control switches 34a to 34d is turned on according to the combination of values respectively represented by the input signal A and the input signal B, and that other power-supply-control switches are turned off, similarly to the LUT 202. Therefore, leakage current of the memory groups included in the LUT 203 may be reduced to ¼.

Incidentally, in the case of the LUTs respectively illustrated in FIGS. 16 and 17, the power supply to the memories is controlled, based on the two input signals.

However, the power supply to the memories may be performed, based on three or more input signals. Leakage current may be more reduced using a larger number of input signals in controlling the power supply.

The modifications of the first embodiment may be applied to the LUTs according to the second embodiment. For example, the number of inputs to the inner LUTs may vary thereamong. Three or more inner LUTs may be provided. And, the multiplexer 13 for selecting one of outputs from the inner LUTs may be omitted.

In the examples of FIGS. 15-17, the power-supply-control switch is provided between the power supply wire and the memory group and between the memory group and the ground wire. However, as mentioned above in relation to the example of FIG. 12, the power-supply-control switch may be provided only between the power supply wire and the memory group, or between the memory group and the ground wire.

According to the configuration of the above embodiments, LUTs with short delay time can be provided. The invention is not limited to the above embodiments. Various changes can be made to the above embodiments without departing from the spirit and scope of the invention.

The invention claimed is:

1. A semiconductor integrated circuit, comprising:
a plurality of input wires comprising: a first input wire; and a second input wire;
a first look-up table (LUT) comprising:
a first memory group comprising a plurality of first memories;
a first output terminal; and
a first multiplexer comprising a first number of first switches connected to the first input wire and a second number of second switches connected to the second input wire, the second number being less than the first number, the first multiplexer being configured to transfer information from one of the first memories to the first output terminal according to signals input from the input wires; and
a second LUT comprising:
a second memory group comprising a plurality of second memories;
a second output terminal; and
a second multiplexer comprising a third number of third switches connected to the second input wire and a fourth number of fourth switches connected to the first input wire, the fourth number being less than the third number, the second multiplexer being configured to transfer information from one of the second memories to the second output terminal according to the signals input from the input wires.

2. The semiconductor integrated circuit of claim 1, further comprising:

a third multiplexer configured to select the information output from the first output terminal of the first LUT and the information output from the second output terminal of the second LUT.

3. The semiconductor integrated circuit of claim 2, further comprising:
a third output terminal configured to output the information selected by the third multiplexer;
a fourth output terminal configured to output the information output from the first multiplexer of the first LUT; and
a fifth output terminal configured to output the information output from the second multiplexer of the second LUT.

4. The semiconductor integrated circuit of claim 1, wherein the second number is 2.

5. The semiconductor integrated circuit of claim 1, wherein the first LUT is connected to N input wires including the first input wire and the second input wire, and
wherein the second LUT is connected to M input wires including the first input wire and the second input wire (M<N).

6. The semiconductor integrated circuit of claim 1, further comprising:
a first power-supply-control switch provided between a power-supply/ground wire and the first memory group; and
a second power-supply-control switch provided between the power-supply/ground wire and the second memory group.

7. The semiconductor integrated circuit of claim 6, further comprising:
a first power-supply-control memory connected to the first power-supply-control switch; and
a second power-supply-control memory connected to the second power-supply-control switch,
wherein each of the first and second memories is a non-volatile memory, and
wherein the first and second power-supply-control switches are controlled according to information stored in the first and second power-supply-control memories, respectively.

8. The semiconductor integrated circuit of claim 1, wherein each of the first and second memories is a non-volatile memory.

9. The semiconductor integrated circuit of claim 1, further comprising:
a first power-supply-control switch provided between a power-supply/ground wire and a first part of the first memories and between the power-supply/ground wire and a first part of the second memories;
a second power-supply-control switch provided between the power-supply/ground wire and a second part of the first memories and between the power-supply/ground wire and a second part of the second memories;
wherein each of the first and second memories is a non-volatile memory, and wherein the first and second power-supply-control switches are complementarily controlled.

10. The semiconductor integrated circuit of claim 9 wherein the input wires further comprises a third input wire connected to the first and second power-supply-control switches,
wherein the first and second power-supply-control switches are complementarily controlled according to a signal input from the third input wire.

11. The semiconductor integrated circuit of claim 9, further comprising:
a plurality of third input wires connected to each of the first and second power-supply-control switches,
wherein the first and second power-supply-control switches are complementarily controlled according to signals input from the third input wires.

12. A semiconductor integrated circuit, comprising:
first to Nth input wires, N being an integer larger than 1;
a first look-up table (LUT) comprising:
a first memory group comprising $2^N$ memories;
a first output terminal; and
a first multiplexer comprising first to N-th stage switch groups, the first stage switch group being connected to the first memory group, the N-th stage switch group being connected to the first output terminal, the i-th stage switch group comprising $2^{(N-i+1)}$ switches and being controlled by a signal input from the i-th input wire, i being integer ranging from 1 to N; and
a second LUT comprising:
a second memory group comprising $2^N$ memories;
a second output terminal; and
a second multiplexer comprising first to N-th stage switch groups, the first stage switch group being connected to the second memory group, the N-th stage switch group being connected to the second output terminal, the i-th stage switch group comprising $2^{(N-i+1)}$ switches and being controlled by the signal input from the (N-i+1)-th input wire.

13. A semiconductor integrated circuit, comprising:
a plurality of input wires;
a memory group comprising a plurality of non-volatile memories;
a first power-supply-control switch provided between a power-supply/ground wire and a part of the non-volatile memories and controlled with a signal input from one of the input wires;
a second power-supply-control switch provided between the power-supply/ground wire and the other part of the non-volatile memories and controlled with the signal input from the one of the input wires; and
a switch group connected to the non-volatile memories and controlled with a signal input from the other of the input wires.

* * * * *